United States Patent
Kleinsorge et al.

(10) Patent No.: US 7,013,114 B2
(45) Date of Patent: Mar. 14, 2006

(54) IMPEDENCE-MATCHED TRANSMITTING DEVICE HAVING HIGH INTERFERENCE IMMUNITY

(75) Inventors: Mathias Kleinsorge, Issum (DE); Jörg Nagel, Krefeld (DE)

(73) Assignee: Siemens Aktiengesellschaft, Munich (DE)

( * ) Notice: Subject to any disclaimer, the term of this patent is extended or adjusted under 35 U.S.C. 154(b) by 82 days.

(21) Appl. No.: 10/250,518

(22) PCT Filed: Dec. 19, 2001

(86) PCT No.: PCT/DE01/04823

§ 371 (c)(1),
(2), (4) Date: Jul. 3, 2003

(87) PCT Pub. No.: WO02/054607

PCT Pub. Date: Jul. 11, 2002

(65) Prior Publication Data

US 2004/0053580 A1    Mar. 18, 2004

(30) Foreign Application Priority Data

Jan. 3, 2001    (DE) ............................... 101 00 152

(51) Int. Cl.
*H04B 1/02*    (2006.01)

(52) U.S. Cl. ...................... 455/107; 455/121; 455/126; 343/852; 343/860

(58) Field of Classification Search ............. 455/127.3, 455/121, 117, 78, 83, 63.1, 66.1, 522, 575.1, 455/550.1, 561, 424, 425, 13.4, 129, 127.2, 455/95, 114.1–114.2, 296, 114.3, 127.1, 256, 455/257, 239.1–250.1, 269, 271, 278.1, 232.1, 455/253.2, 115.1, 91, 107, 103, 341, 344, 455/575.7; 375/298, 308, 309, 311, 312; 330/51, 298, 53, 151, 129, 124, 280; 333/17.1, 333/109, 115, 116; 343/858, 860, 852; 332/117
See application file for complete search history.

(56) References Cited

U.S. PATENT DOCUMENTS

| | | | | |
|---|---|---|---|---|
| 5,768,690 A | * | 6/1998 | Yamada et al. | ............... 455/78 |
| 5,909,643 A | * | 6/1999 | Aihara | .................... 455/127.3 |
| 6,034,999 A | * | 3/2000 | Kirisawa | .................... 375/295 |

FOREIGN PATENT DOCUMENTS

| | | |
|---|---|---|
| EP | 0 741 463 | 11/1996 |
| EP | 0 936 745 | 8/1999 |

* cited by examiner

Primary Examiner—Edward F. Urban
Assistant Examiner—Charles Chow
(74) Attorney, Agent, or Firm—Bell, Boyd & Lloyd LLC

(57) ABSTRACT

According to the present invention, the resistance to interference of a transmitting device, which is particularly embodied as a high frequency transmitter with a transmitter amplifier may be improved, whereby a loss-affected network, for example, in the form of a matching resistance, is coupled to the output of the transmitter amplifier, particularly in the case of low output power of the transmitter amplifier, in order to introduce an impedance-matching at the output of the transmitter amplifier. As such, the reflection of an interference signal coming from a transmitter antenna at the output of the transmitter amplifier can thus be reduced.

11 Claims, 1 Drawing Sheet

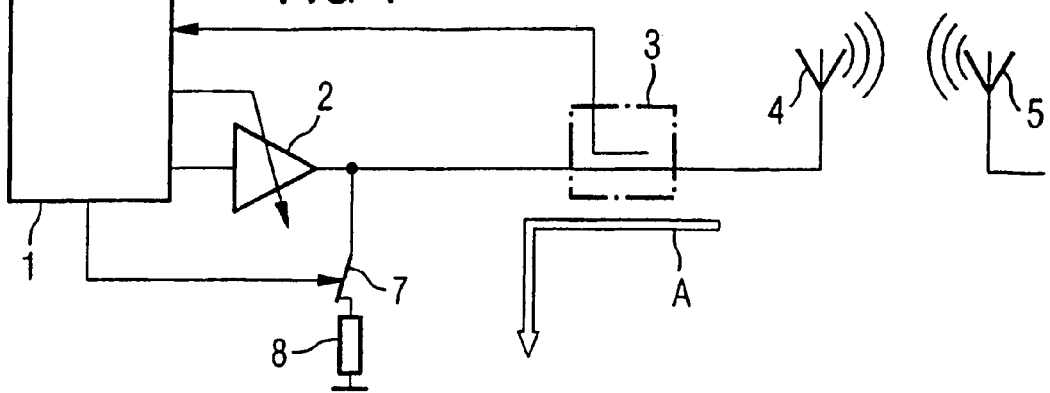
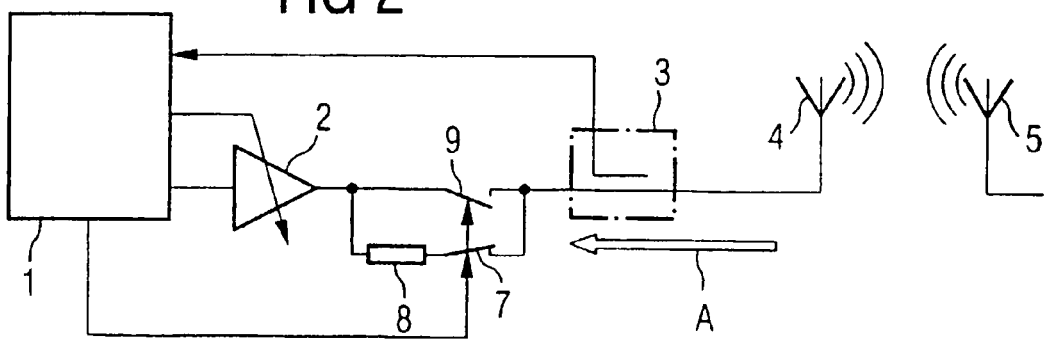
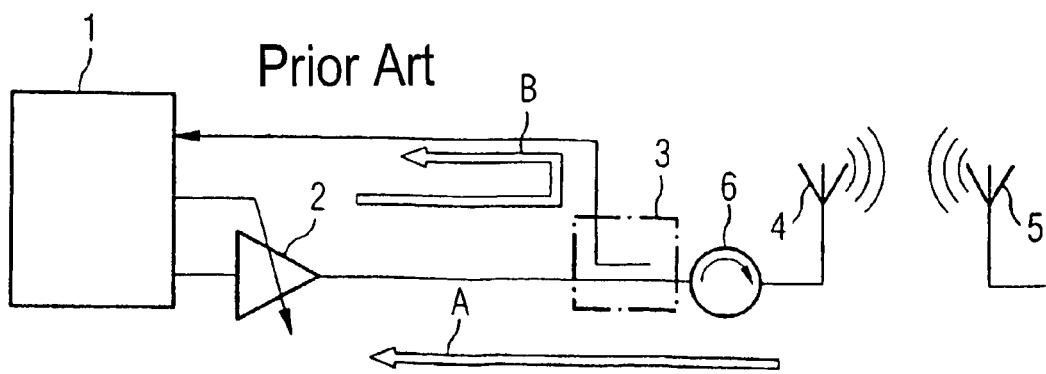

IMPEDENCE-MATCHED TRANSMITTING DEVICE HAVING HIGH INTERFERENCE IMMUNITY

BACKGROUND OF THE INVENTION

The present invention relates to a transmitting device, in particularly a high-frequency transmitting device, for use in a mobile radio system, for example.

A conventional high-frequency transmitting device in accordance with the prior art is shown, by way of example, in FIG. 3. This high-frequency transmitting device includes a transmit signal generator 1 for generation of a modulated high-frequency (HF) signal that is applied to a transmitter amplifier 2. In high-frequency transmitters, particularly in mobile radio transmitters, part of the output power generated by the transmitter amplifier 2 is frequently decoupled in order to control the output power; i.e., the amplification of the transmitter amplifier 2, or the modulation effected by the transmitted signal generator 1. For this purpose, a device 3 for decoupling part of the output power generated by the transmitter amplifier 2 is provided, as shown in FIG. 3, in order to apply the part of the output power decoupled in this way to the transmitted signal generator 1 for power or modulation control.

The power or modulation control can, however, be disturbed by interference signals that are mixed with the decoupled or feedback signals from the device 3. These interference signals can derive both from reflected transmitter power and from other transmission sources 5, and they consist of signals received via the antenna 4. The magnitude of the interference power relative to the decoupled transmitter power is generally decisive for the interference effect, so that the interference susceptibility is highest where the transmitter power is lowest.

Generally, a so-called directional coupler is used as the device 3 in order to ensure that the signal applied to the transmitted signal generator 1 particularly includes the wave passing from the transmitter amplifier 2 to the antenna 4, but not the wave coming from antenna 4. The directional effect of this directional coupler 3 can significantly improve the interference immunity to reflections and radiations from external sources 5, provided the interference signal coming from the antenna 4 is not reflected from the transmitter amplifier 2 and again passes through the directional coupler 3, as indicated by arrows A and B in FIG. 3. In this case arrow A represents the interference signal made up of the reflected transmitter power and the transmitted signal originating from the antenna 5 and received via antenna 4, whereas arrow B designates the interference signal then reflected from the transmitter amplifier 2, decoupled from the directional coupler 3 and finally applied to the transmitted signal generator 1. The reflection of the interference signal coming from antenna 4, already described and shown in FIG. 3, at the output of the transmitter amplifier 2 is, however, generally of a high degree because there is no impedance matching. As such, the interference immunity of the high-frequency transmitter can only be slightly improved by using a directional coupler 3.

For this reason, the use of non-reciprocal components 6, such as insulators, in the transmitted signal path was proposed to attenuate the interference signal coming from the antenna 4. These non-reciprocal components 6 have a directional-dependent attenuation that differs greatly so that the signal direction from the antenna 4 to the transmitter amplifier 2 is blocked. Non-reciprocal components or isolators 6 of this kind nevertheless have a residual attenuation in the forward direction (i.e., in the direction from the transmitter amplifier 2 to the antenna 4), that results in an increase in the transmitter power to be applied from the high frequency transmitter and also in the cost and space requirement of these components. Furthermore, insulators are generally narrowband components.

Document EP-A-936 745 discloses a transmitting device whereby a transmitted signal generated by a transmitted signal generator is applied to a transmitter amplifier to amplify the transmitted signal. Furthermore, a circuit is provided that has a specific impedance and can be coupled to the output of the transmitter amplifier Document EP-A-741 463 discloses a transmitting device with a signal generator for generation of a transmitted signal, a transmitter amplifier for amplification of the transmitted signal, connected after the transmitted signal generator, together with a sampler downstream of the transmitter amplifier that is connected to an output power detection device, and a circulator connected after the sampler.

An object of the present invention is, therefore, to provide a transmitter device in accordance with the generic kind that provides a sufficiently high interference immunity without also using non-reciprocal components.

SUMMARY OF THE INVENTION

In accordance with the present invention, it is proposed to couple a circuit to the output of the transmitter amplifier of the transmitting device, that can be particularly designed as a high-frequency transmitter, wherein the circuit has a specific impedance so that with the aid of this circuit an impedance matching can be provided at the output of the transmitter amplifier. This results in a clear reduction in the reflection of the interference signal at the output of the transmitter amplifier.

The circuit already described can, for example, be just a resistor, the resistance value of which is chosen to correspond to the original output matching of the transmitter amplifier. With an ideal characteristic of the output transistor of the transmitter amplifier, with a resistance value going towards infinity, the resistance value can be chosen as 50 Ohm corresponding to the characteristic impedance.

The circuit, which generally could be designated a loss-affected network, can be connected parallel to the transmitter amplifier or parallel to the output transistor of the transmitter amplifier. It is also conceivable to connect the circuit in series with the output transmitter of the transmitter amplifier, so that the required impedance between the output of the transmitter amplifier and the directional coupler is obtained. The directional effect of the directional coupler can, in this way, be efficiently used to increase the interference immunity, which is critical, particularly at small transmitter powers.

The reduced efficiency of the transmitter amplifier due to the forced matching that can be achieved with the aid of the present invention results in there being no high operating current because of the small transmitter power. However, to ensure that no additional losses due to the forced matching occur even at high transmitter powers, it is preferable to provide a controllable switch so that, in this case, the impedance can be disconnected from the output transistor of the transmitter amplifier. Thus, with the aid of the present invention, in contrast to the prior art already described, the high interference immunity that is present anyway at high transmitter powers can be utilized without additional insulation losses.

Additional features and advantages of the present invention are described in, and will be apparent from, the following Detailed Description of the Invention and the Figures.

BRIEF DESCRIPTION OF THE FIGURES

FIG. 1 shows a high-frequency transmitter in accordance with a first exemplary embodiment of the present invention.

FIG. 2 shows a high-frequency transmitter in accordance with a second exemplary embodiment of the present invention.

FIG. 3 shows a high-frequency transmitter according to the prior art.

DETAILED DESCRIPTION OF THE INVENTION

The basic concept of the present invention is, with a transmitting device that has a transmitted signal generator for generation of a transmitted signal, particularly a high-frequency transmitted signal and, after the transmitted signal generator, a transmitter amplifier for amplification of the transmitted signal, to couple a circuit or loss-affected network with a specific impedance to the output of the transmitter amplifier in such a way that an impedance matching is achieved at the output of the transmitter amplifier. In this way, the reflection, using the prior art already described with reference to FIG. 3, of the interference signal at the transmitter amplifier output coming from the transmitting antenna can be prevented or at least distinctly reduced.

The exemplary embodiment shown in FIG. 1 is a high-frequency transmitter with a transmitted signal generator 1 for generation of a modulated high-frequency transmitted signal that is applied to a transmitter amplifier 2. As already explained using FIG. 3, a directional coupler 3 is placed after the transmitter amplifier 2 and decouples part of the transmitter or output power generated by the transmitter amplifier 2 and applies it to the transmitted signal generator 1. This is done in order to enable control of the output power or amplification of the transmitter amplifier 2 or of the modulation carried out by the transmitted signal generator 1. The transmitted signal is then radiated from a transmitting antenna 4. As already explained using FIG. 3, a signal originating from a different source 5 can be received via the transmitting antenna 4. Furthermore, reflections of the transmitter power can occur which result in an interference signal directed from the transmitting antenna 4 to the transmitter amplifier 2. Because of the directional effect of the directional coupler 3, a relatively good interference immunity with respect to this interference signal A is obtained, provided the interference signal coming from transmitting antenna 4 is not reflected from transmitter amplifier 2 and again passed through the directional coupler 3.

To prevent this kind of reflection of the interference signal A at the output of the transmitter amplifier 2, a loss-affected network in the form of a matching resistor 8 is provided in the exemplary embodiment shown in FIG. 1, which at small output or transmitter power of the transmitter amplifier 2 is connected parallel to the transmitter amplifier 2; in particular, parallel to the (not illustrated) output transistor of the transmitter amplifier 2. The resistance value of the matching resistor 8, is in this case, to be selected relative to the output matching of the transmitter amplifier 2, so that a matching of the wave of the interference signal A passing in the direction of the transmitter amplifier 2 can be achieved by switching the matching resistor 8 in that direction. In this way, the reflection of the interference signal A at the output of the transmitter amplifier 2 can be distinctly reduced at small output or transmitter powers due to the current-source nature of the output transistor of the transmitter amplifier 2, so that the directional effect of the directional coupler 3 can be efficiently used to increase the interference immunity. This is critical, particularly at small output powers. The reduced efficiency of the transmitter amplifier 2, due to the forced matching achieved because of the connected matching resistor 8, cannot result in a high operating current because of the small output power.

In order not to cause additional losses at high output powers, the matching resistor 8 can be coupled via a controllable switch 7 to the output of the transmitter amplifier 2, so that at high output powers the matching resistor 8 can be disconnected from the output transistor of the transmitter amplifier 2 by opening the switch 7. Thus, the high interference immunity of the high frequency transmitter, present in any case at high output powers, can be used without additional losses. The limit value selected to provide a distinction between a low output power and a high output power and, thus, as a limiting condition for closing or opening the switch 7, depends inter alia on the power consumption of the high frequency transmitter.

The achieved matching, shown in the exemplary embodiment in FIG. 1, of the wave of the interference signal A running in the direction of the transmitter amplifier output also can be achieved by switching a suitable impedance between the output of the transmitter amplifier 2 and the directional coupler 3. A corresponding exemplary embodiment is shown in FIG. 2, with the same reference characters being used for the components corresponding to the exemplary embodiment shown in FIG. 1 and with reference being made to the above explanations from FIG. 1 to avoid repeated description of these components.

With the exemplary embodiment shown in FIG. 2, a parallel arrangement from a series circuit consisting of a matching resistor 8 and a first controllable switch 7 and a second controllable switch 9 is connected between the output of the transmitter receiver 2 and the directional coupler 3. At low output powers of the transmitter amplifier 2, which can be detected by evaluating the performance decoupled from the directional coupler 3, the first controllable switch 7 is closed and the second controllable switch 9 is open, so that the series circuit consisting of the matching resistor 8 and the first controllable switch 7 between the output of the transmitter amplifier 2 and the directional coupler 3 is active and an impedance matching is achieved at the output of the transmitter amplifier. At high output powers, on the other hand, the first switch 7 is open and the second switch 9 closed, so that the matching resistor 8 is no longer connected between the output of the transmitter amplifier 2 and the directional coupler 3.

Although the present invention has been described with reference to specific embodiments, those of skill in the art will recognize that changes may be made thereto without departing from the spirit and scope of the present invention as set forth in the hereafter appended claims.

The invention claimed is:

1. A transmitting device, comprising:
    a transmitted signal generator for generating a transmitted signal;
    a transmitter amplifier for amplifying and outputting the amplified transmitted signal at an output of the transmitter amplifier, the transmitter amplifier being connected after the transmitted signal generator;

a directional coupler for decoupling part of an output power of the transmitted signal generated by the transmitter amplifier and for applying the decoupled part of the output power to the transmitted signal generator to enable control of the output power of one of the transmitter amplifier and a modulation performed by the transmitted signal generator to be achieved, the directional coupler being connected after the transmitter amplifier; and a circuit having a specific impedance which is coupled directly to the output of the transmitter amplifier to match the output of the transmitter amplifier, wherein said circuit does not contain non-reciprocal components, and wherein an impedance of the circuit is chosen so that matching to a wave of an interference signal running in a direction of the output of the transmitter amplifier can be achieved, and a reflection of the interference signal at the output of the transmitter amplifier is accordingly reduced.

2. A transmitting device as claimed in claim 1, wherein the transmitted signal generator generates a high-frequency transmitted signal.

3. A transmitting device as claimed in claim 1, further comprising a controllable switch for connecting the circuit with a specific impedance as required in series with the output of the transmitter amplifier and for disconnecting the circuit from the output of the transmitter amplifier.

4. A transmitting device as claimed in claim 3, further comprising a directional coupler for decoupling part of the transmitted power of the transmitter amplifier, wherein the circuit with the specific impedance may be connected via the controllable switch as required in series between the output of the transmitter amplifier and the directional coupler.

5. A transmitting device as claimed in claim 3, wherein the circuit with the specific impedance may be connected via the controllable switch as required in series between an output transistor of the transmitter amplifier and the directional coupler.

6. A transmitting device as claimed in claim 3, further comprising a controller for closing the controllable switch if the output power of the transmitter amplifier is less than a specified limit value, and for opening the controllable switch if the output power of the transmitter amplifier is greater than the specified limit value.

7. A transmitting device as claimed in claim 1, further comprising a controllable switch for one of switching the circuit with the specific impedance as required parallel to the transmitter amplifier and disconnecting the circuit from the output of the transmitter amplifier.

8. A transmitting device as claimed in claim 7, wherein the circuit with the specific impedance may be connected parallel to an output transistor of the transmitter amplifier via the controllable switch.

9. A transmitting device as claimed in claim 1, wherein the impedance of the circuit is formed by a resistor.

10. A transmitting device as claimed in claim 1, wherein the impedance of the circuit is chosen so that an impedance matching is present at the output of the transmitter amplifier when the circuit is connected to the output of the transmitter amplifier.

11. A transmitting device as claimed in claim 1, wherein the transmitting device is part of a mobile radio terminal device.

* * * * *